(12) United States Patent
Kube et al.

(10) Patent No.: US 9,571,030 B2
(45) Date of Patent: Feb. 14, 2017

(54) UNIVERSALLY MOUNTED SOLAR MODULE

(71) Applicants: Keith Allen Kube, Clinton, IA (US); Mike Lawrence, Albia, IA (US); James L. Law, Clinton, IA (US)

(72) Inventors: Keith Allen Kube, Clinton, IA (US); Mike Lawrence, Albia, IA (US); James L. Law, Clinton, IA (US)

( * ) Notice: Subject to any disclaimer, the term of this patent is extended or adjusted under 35 U.S.C. 154(b) by 6 days.

(21) Appl. No.: 14/639,634

(22) Filed: Mar. 5, 2015

(65) Prior Publication Data
US 2015/0256121 A1    Sep. 10, 2015

Related U.S. Application Data

(60) Provisional application No. 61/948,115, filed on Mar. 5, 2014.

(51) Int. Cl.
*H02S 20/10* (2014.01)
*H02S 30/10* (2014.01)
*H01L 31/18* (2006.01)

(52) U.S. Cl.
CPC .............. *H02S 20/10* (2014.12); *H01L 31/18* (2013.01); *H02S 30/10* (2014.12); *Y02P 70/521* (2015.11); *Y10T 29/49355* (2015.01)

(58) Field of Classification Search
CPC .. E04F 15/020464; H02S 20/00; F24J 2/5211; F24J 2/5245; F24J 2/5258; F24J 2/5264; E04D 11/007
USPC .......... 52/122.1, 126.1, 126.5, 126.6, 126.7, 52/173.3; 248/188.1, 188.3, 188.4, 188.5, 248/237; 136/244
See application file for complete search history.

(56) References Cited

U.S. PATENT DOCUMENTS

| | | | | |
|---|---|---|---|---|
| 8,176,693 B2 * | 5/2012 | Abbott | .................... | F16B 2/185 52/173.1 |
| 8,272,189 B2 * | 9/2012 | Chan | ..................... | F24J 2/5211 52/173.3 |
| 8,387,319 B1 * | 3/2013 | Gilles-Gagnon | ...... | F24J 2/5205 52/173.3 |
| 8,413,944 B2 * | 4/2013 | Harberts | ................ | F24J 2/5205 248/500 |
| 8,461,449 B2 * | 6/2013 | Kobayashi | ............. | F24J 2/5211 123/623 |
| 8,578,666 B2 * | 11/2013 | Yen | ........................ | F24J 2/5247 126/621 |
| 8,776,454 B2 * | 7/2014 | Zuritis | ................... | F24J 2/5207 126/621 |

(Continued)

*Primary Examiner* — Joshua J Michener
*Assistant Examiner* — Matthew Gitlin
(74) *Attorney, Agent, or Firm* — Zarley Law Firm, P.L.C.

(57) ABSTRACT

A solar module has a plurality of solar panels framed within a frame member having side frame members connected to end frame members. Each side frame member and end frame member have a groove and a channel, and side frame members also have an elongated flange that raises up the solar panel a distance to allow cooling air to pass under the solar panel. Framed solar panels are connected to lengthwise support members having top, bottom and side channels, such as T-slots. These channels allow for easy adjustment and compensates for variability in the installation process. Each solar panel is connected to the lengthwise support members by way of legs. To connect adjacent solar panels to the lengthwise support members, a pair of legs, one long leg and one short leg, are stacked on top of one another and fastened to the lengthwise support member.

9 Claims, 17 Drawing Sheets

(56) References Cited

U.S. PATENT DOCUMENTS

| | | | | |
|---|---|---|---|---|
| 8,801,349 | B2* | 8/2014 | McPheeters | E04D 13/1476 248/216.1 |
| 8,898,967 | B2* | 12/2014 | Bartelt-Muszynski | F24J 2/5203 136/251 |
| 2007/0131273 | A1* | 6/2007 | Kobayashi | F24J 2/5211 136/251 |
| 2008/0313976 | A1* | 12/2008 | Allen | H01L 31/048 52/173.1 |
| 2011/0209422 | A1* | 9/2011 | King | F24J 2/5205 52/173.3 |
| 2012/0234378 | A1* | 9/2012 | West | F24J 2/5211 136/251 |
| 2013/0112247 | A1* | 5/2013 | Li | F24J 2/5211 136/251 |
| 2014/0366464 | A1* | 12/2014 | Rodrigues | H02S 40/32 52/173.3 |

* cited by examiner

UNIVERSALLY MOUNTED SOLAR MODULE

CROSS REFERENCE TO RELATED APPLICATION

This application claims the benefit of U.S. Provisional Application No. 61/948,115 filed Mar. 5, 2014.

FIELD OF THE INVENTION

This invention relates to solar panels. More specifically, and without limitation, this invention relates to a universally mounted solar module.

BACKGROUND OF INVENTION

Solar panels (also known as solar modules, photovoltaic modules or photovoltaic panels) are a packaged, connected assembly of photovoltaic cells (also known as solar cells). Solar panels use light energy (photons) from the sun to generate electricity through the photovoltaic effect. Conventional solar panels are comprised of a substrate, and a superstrate with a plurality of solar cells laminated or sealed between the substrate and the superstrate. Often, the substrate and the superstrate are formed of a plane of glass, ceramic, plastic, composite or the like.

To achieve economies of scale and improve efficiencies, often a plurality of solar panels are used in an array. To further improve efficiencies in residential and commercial applications, a micro inverter is used in association with each solar panel. One challenge to using micro inverters is to achieve the greatest efficiency, the micro inverter should be positioned as close as possible to its associated solar panel.

To produce energy, solar panels are positioned where they are exposed to sunlight. A convenient place to mount solar panels is on the roof of structures. However, due to the angles of various roofing structures mounting solar panels is difficult and complex. In addition as the number of solar panels increases, so does the complexity of the installation. When micro inverters are used in association with each solar panel, this substantially complicates the installation. Furthermore, due to the nature of being positioned on the roof of a structure, the mounting structure must be rigid and durable enough to sustain high winds, such as in a hurricane or thunderstorm, without damage to either the solar panel or the roof.

While mounting a plurality of solar panels together increases the amount of energy that can be generated, mounting solar panels in tight proximity to one another has the unintended negative effect of limiting the air movement around the solar panels which causes the solar panels to heat up. As the temperature of the solar panels increases, the solar panels become less efficient. In addition, excessive heat can also reduce the useful life of the solar panels and cause premature failure. Furthermore, excessive heat is also damaging to micro inverters.

While there are a plurality of mounting structures for solar panels on the market, they tend to be heavy, expensive, complex, and difficult to install, among suffering from countless other deficiencies.

Therefore, despite the advances in solar panel technology, problems still remain. In particular, problems remain in mounting an array of solar panels on the roof of structures in an inexpensive, fast, simple and durable manner.

Thus, it is a primary object of the invention to provide a mounting structure and system for solar panels that resolves the problems of and improves upon the prior art.

Another object of the invention to provide a mounting structure and system for solar panels that is efficient to install.

Yet another object of the invention is to provide a mounting structure and system for solar panels that is inexpensive.

Another object of the invention is to provide a mounting structure and system for solar panels that is easy to use.

Yet another object of the invention is to provide a mounting structure and system for solar panels that is durable while being light weight.

Another object of the invention is to provide a mounting structure and system for solar panels that provides a secure and rugged attachment.

Yet another object of the invention is to provide a mounting structure and system for solar panels that improves and maximizes the efficiency and longevity of solar panels.

Another object of the present invention is to provide a mounting structure and system which allows for increased air to flow through and around the mounting structure and the solar panels mounted therein.

Yet another object of the invention is to provide a mounting structure and system that is convenient and efficient to assemble, install, adjust and use.

Another object of the present invention is to provide a mounting structure and system uses a minimum number of parts.

Yet another object of the invention is to provide a mounting structure and system that allows for easy removal and replacement of solar panels in an array.

Another object of the present invention is to provide a mounting structure and system that allows for adjustment between solar panels in an array.

These and other objects, features, or advantages will become apparent from the specification, drawings and claims.

SUMMARY OF THE INVENTION

A universally mounted solar module is presented. The system has a plurality of solar panels that are framed within a frame member having side frame members connected to end frame members. Each side frame member and end frame member have a center wall, a groove and a channel, and side frame members also have an elongated flange that raises up the solar panel a distance so as to provide a space between the roof and the solar panel and allow for air to pass under the solar panel. The framed solar panels are connected to lengthwise support members having a top, bottom and side channels, such as a T-slot. These channels allow for easy adjustment of the system and compensates for variability in the installation process. Each solar panel is connected to the lengthwise support members by way of legs. To connect adjacent solar panels to the lengthwise support members, a pair of legs, one long leg and one short leg, are stacked on top of one another and fastened to the lengthwise support member.

DETAILED DESCRIPTION OF THE INVENTION

Figure 1:
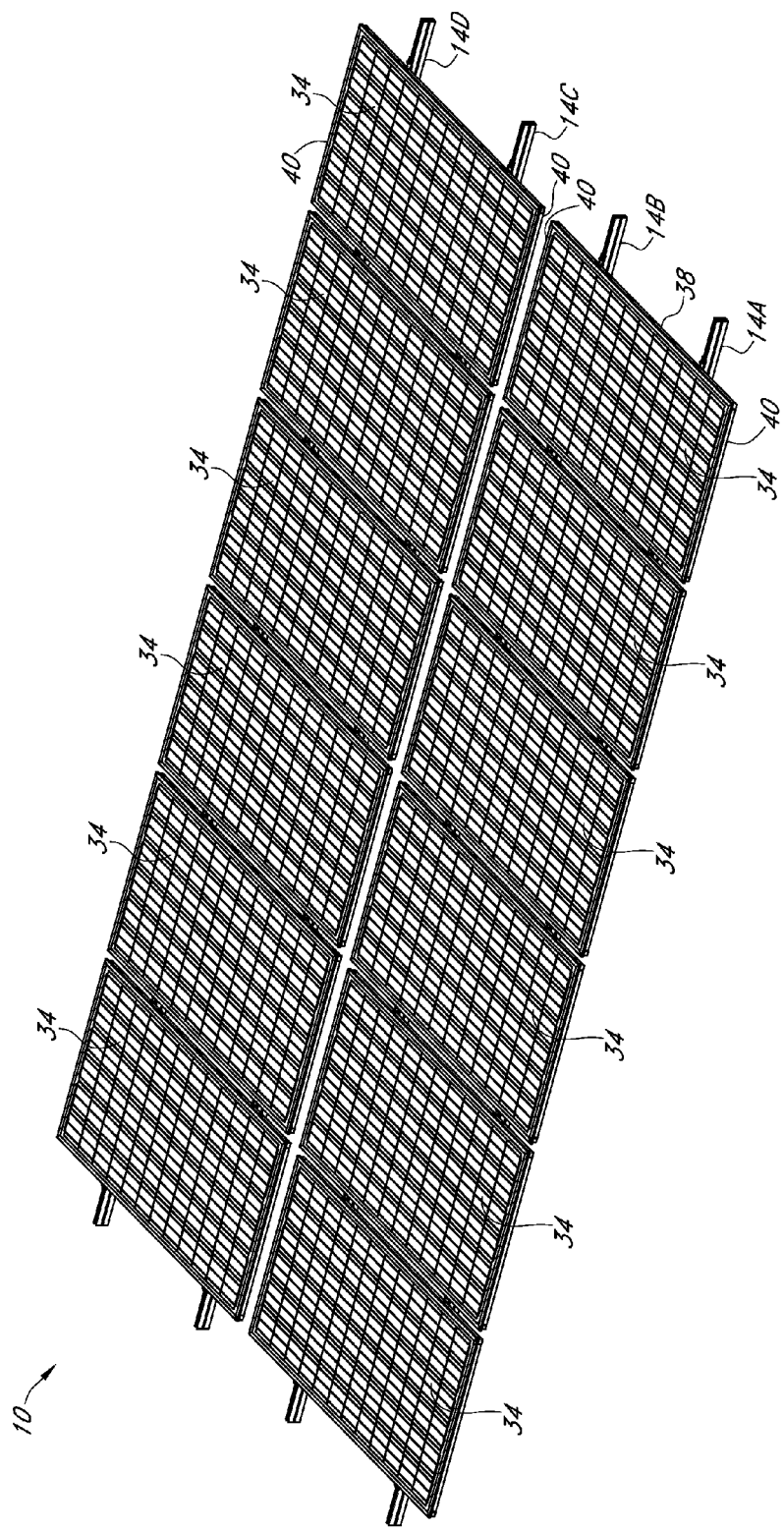
FIG. 1 is a perspective view of a plurality of solar panels assembled in an array of the system presented herein.
Figure 2:
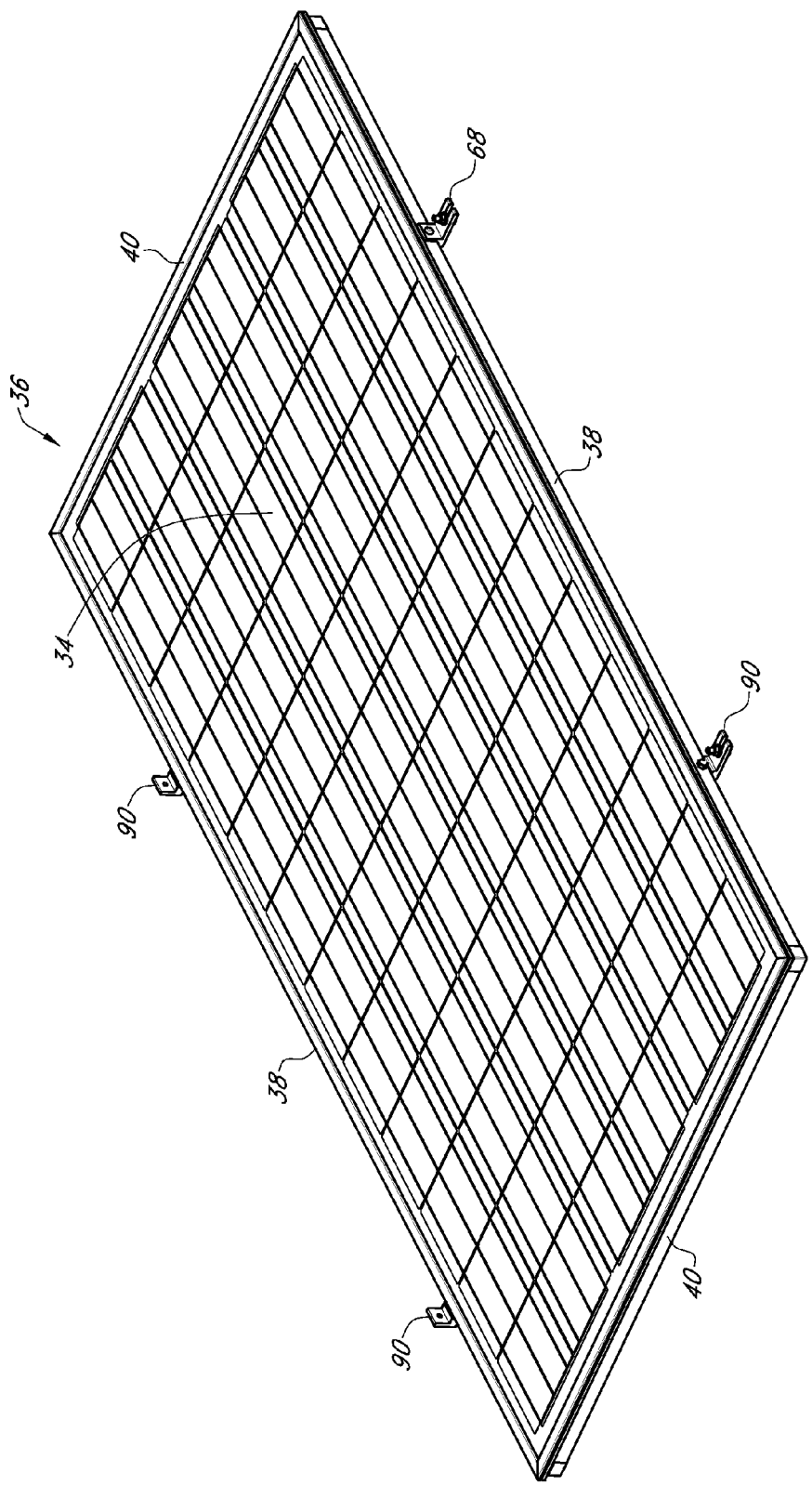
FIG. 2 is a perspective view of a single solar panel of the system presented herein, the view showing a frame formed around the solar panel and a plurality of legs attached to the frame.
Figure 3:
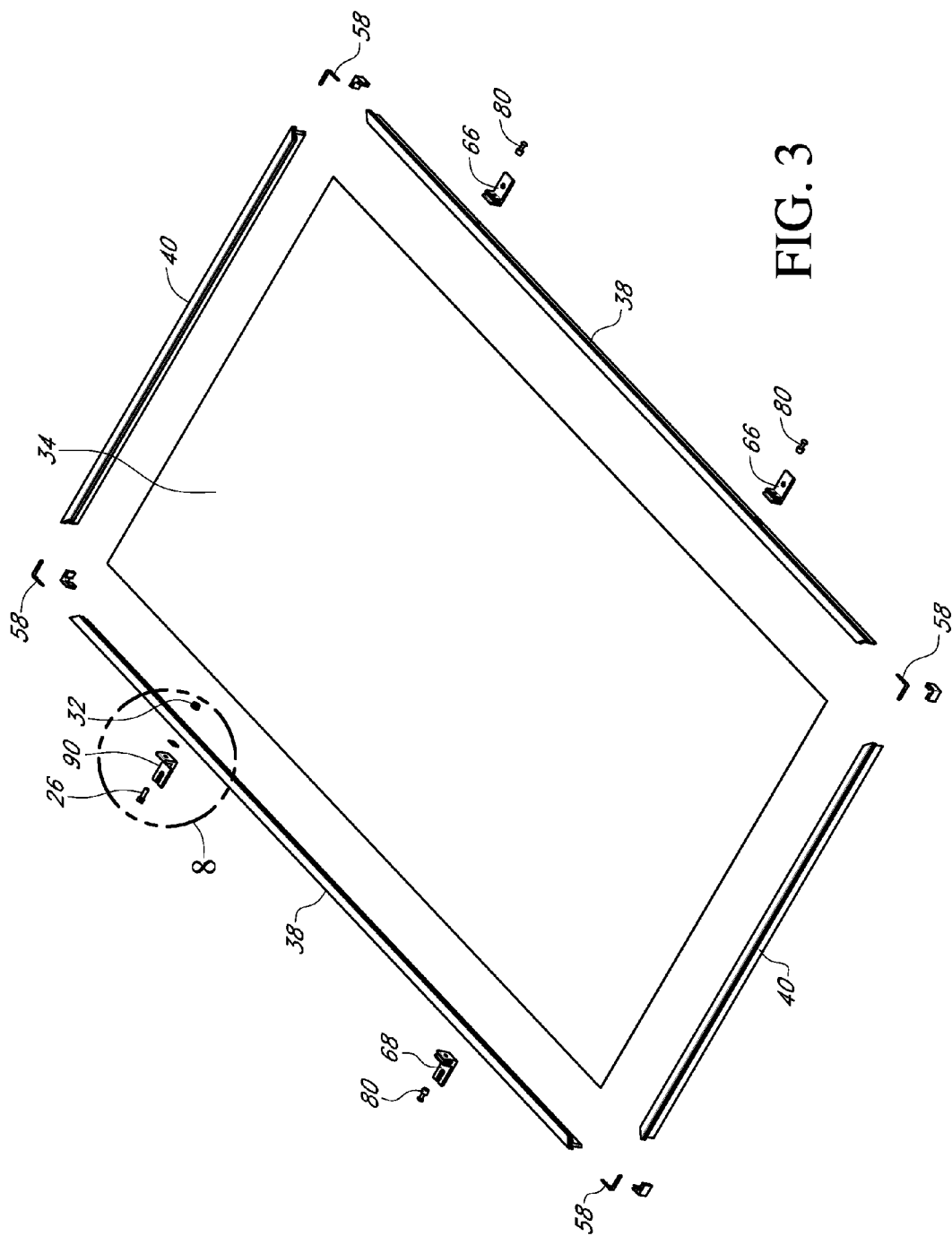
FIG. 3 is an exploded perspective view of a single solar panel of the system presented herein, the view showing a side frame members, end frame members, short legs, long legs, corner connector, a weeb and a weeb leg in exploded form.
Figure 4:
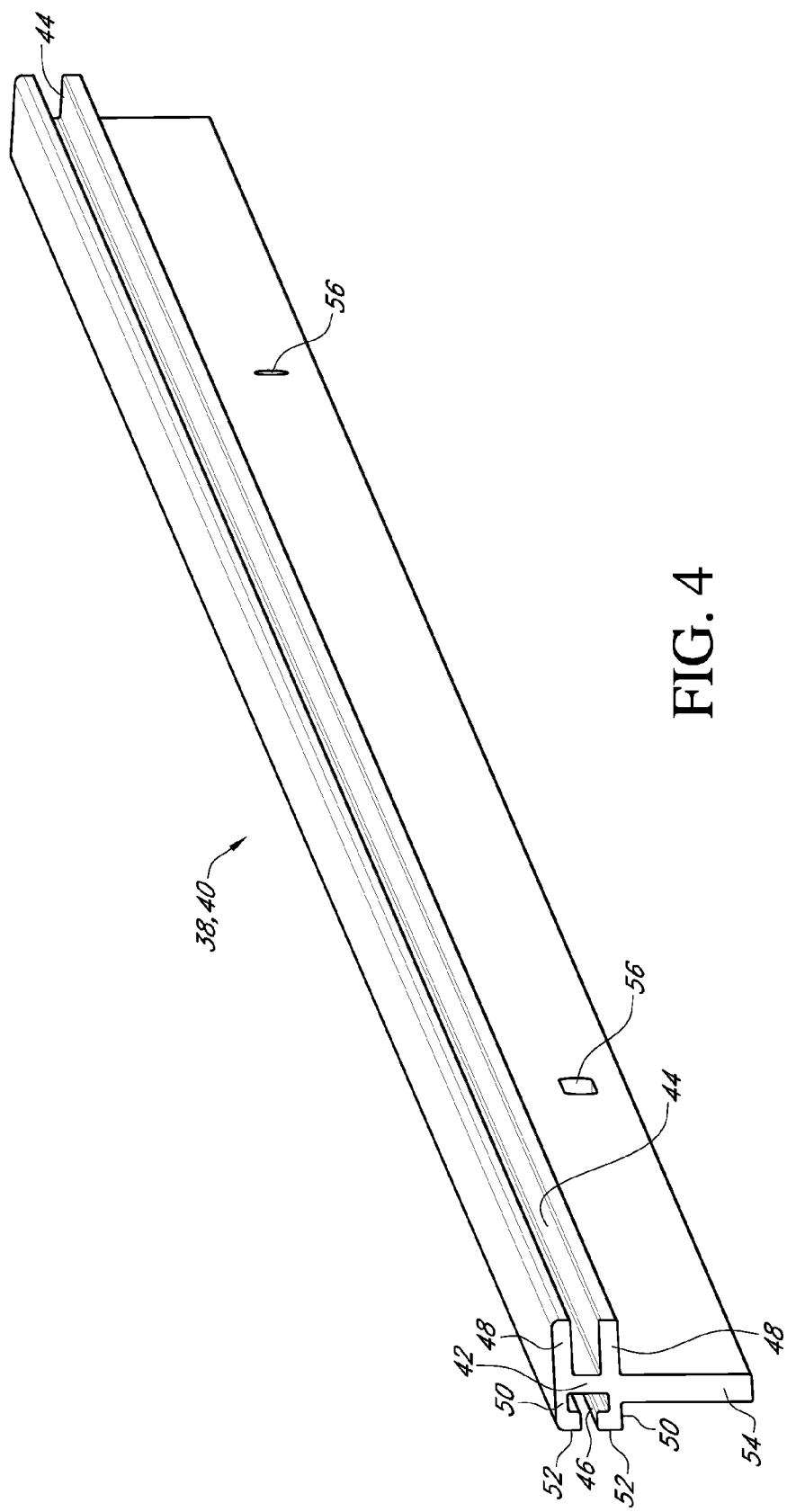
FIG. 4 is a side cut-away perspective view of a side frame member or end frame member.
Figure 5A:
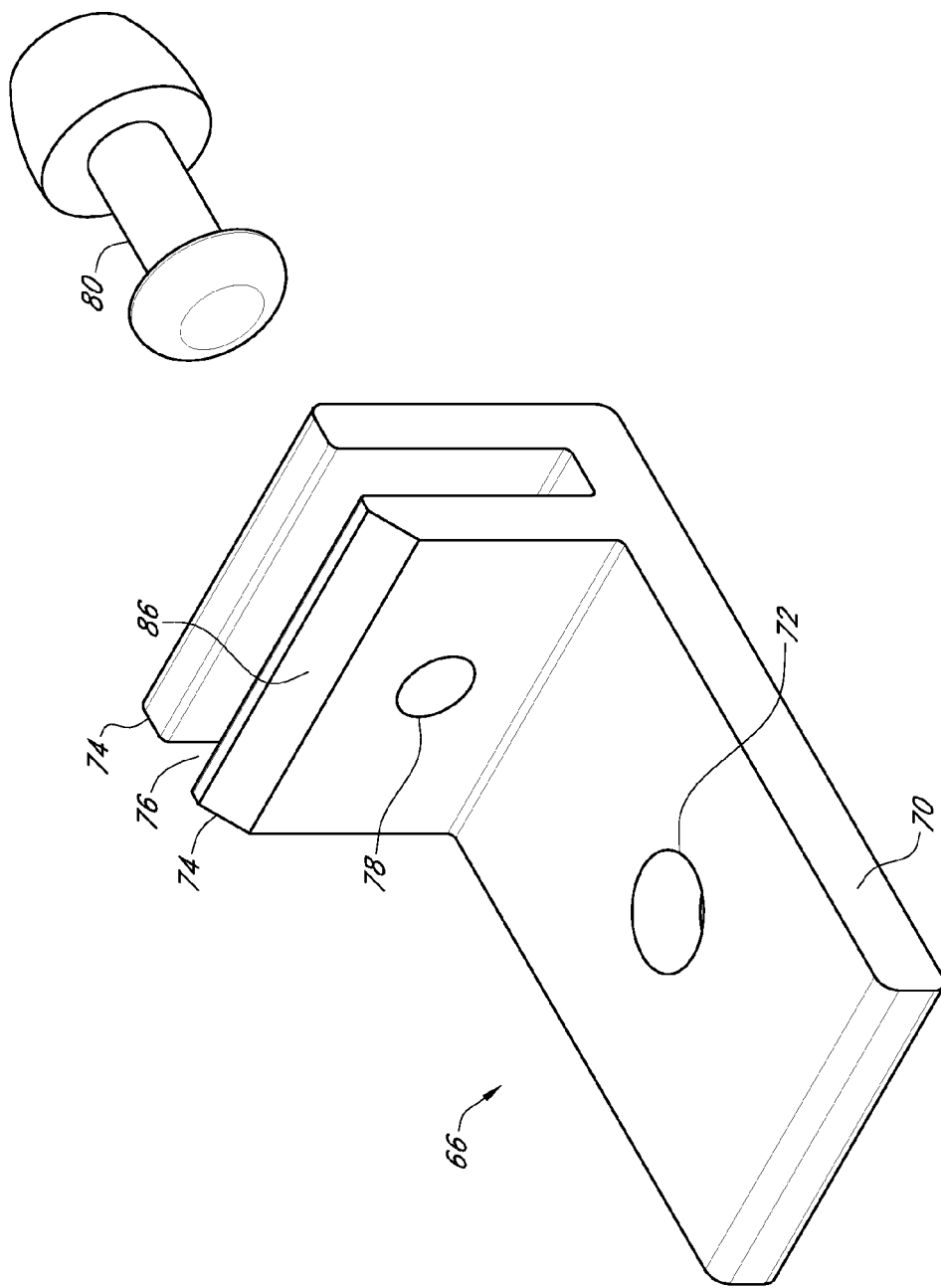
FIG. 5A is a perspective view of a short leg and a rivet.
Figure 5B:
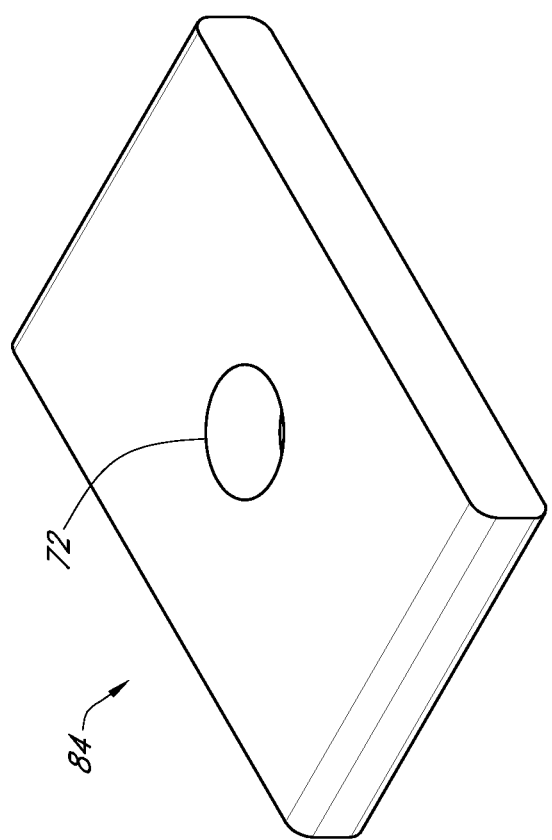
FIG. 5B is perspective view of a spacer for use under a first short leg.
Figure 6:
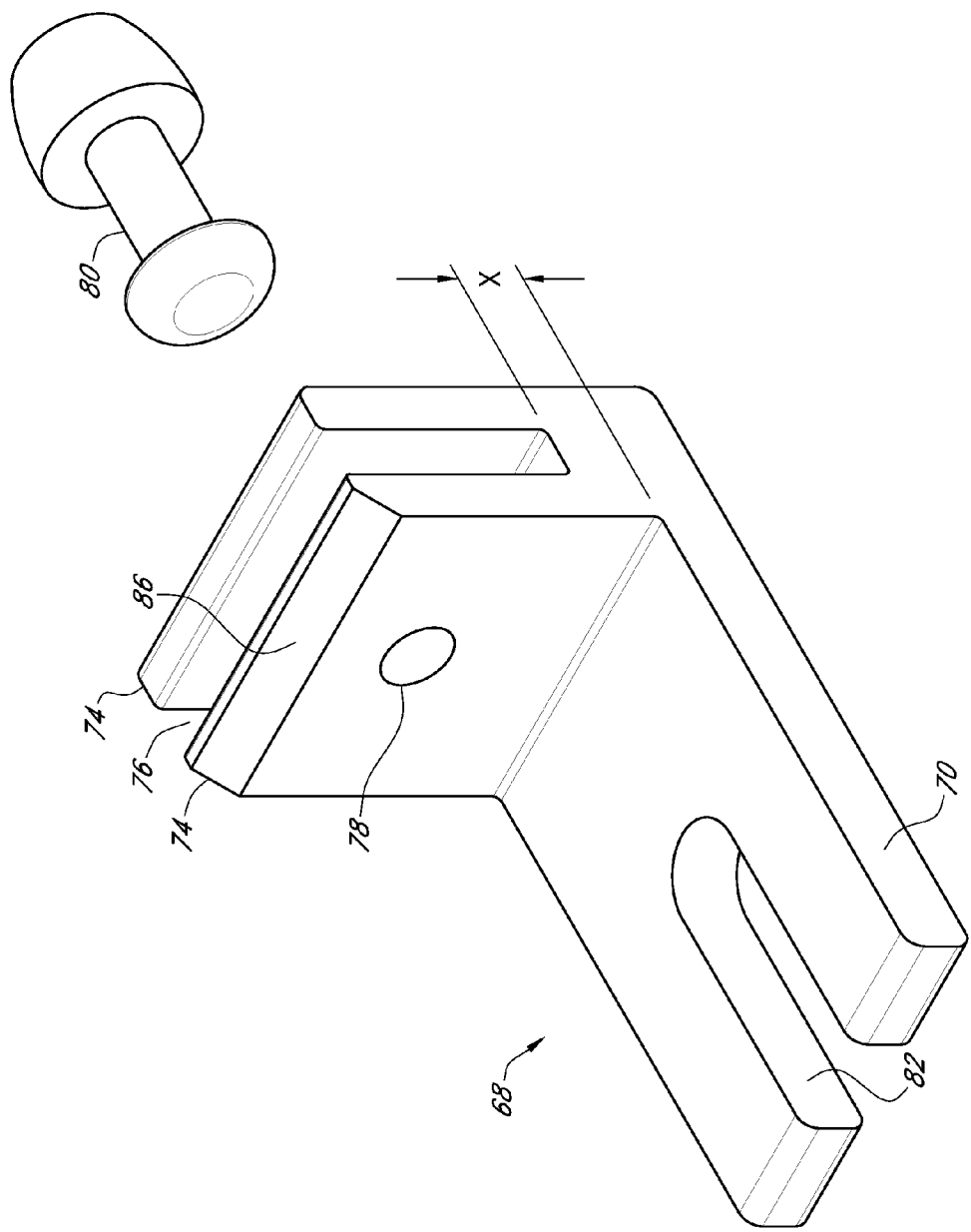
FIG. 6 is a perspective view of a long leg and rivet.
Figure 7A:
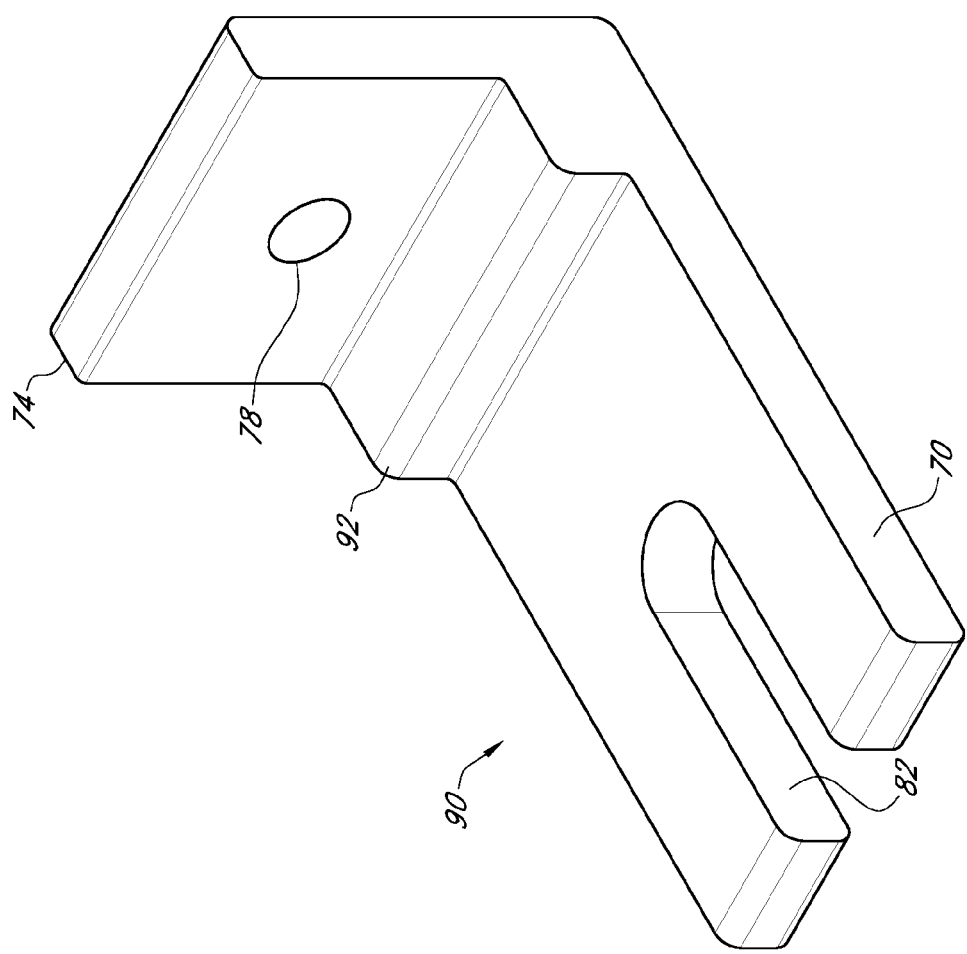
FIG. 7A is a perspective view of a weeb leg and weeb.
Figure 7B:
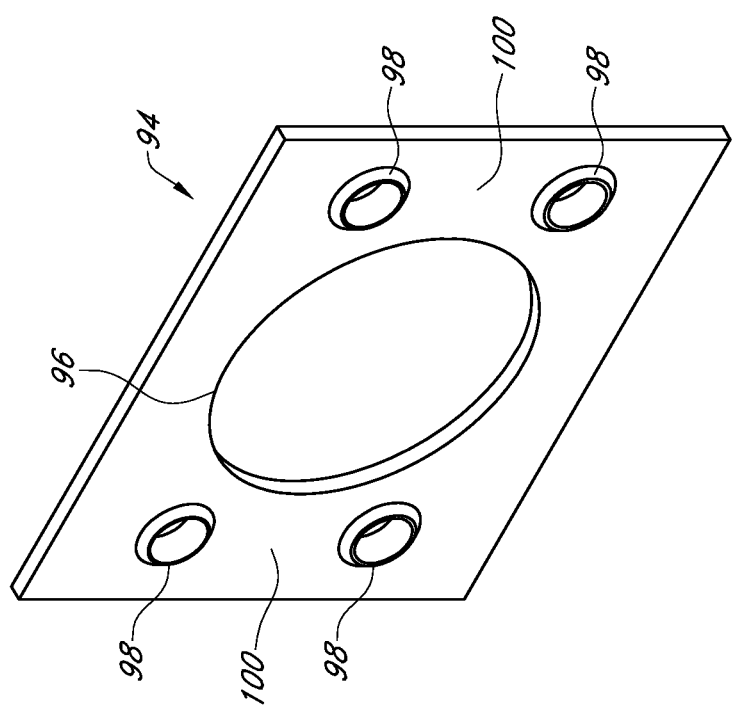
FIG. 7B is a perspective view of a weeb.
Figure 8:
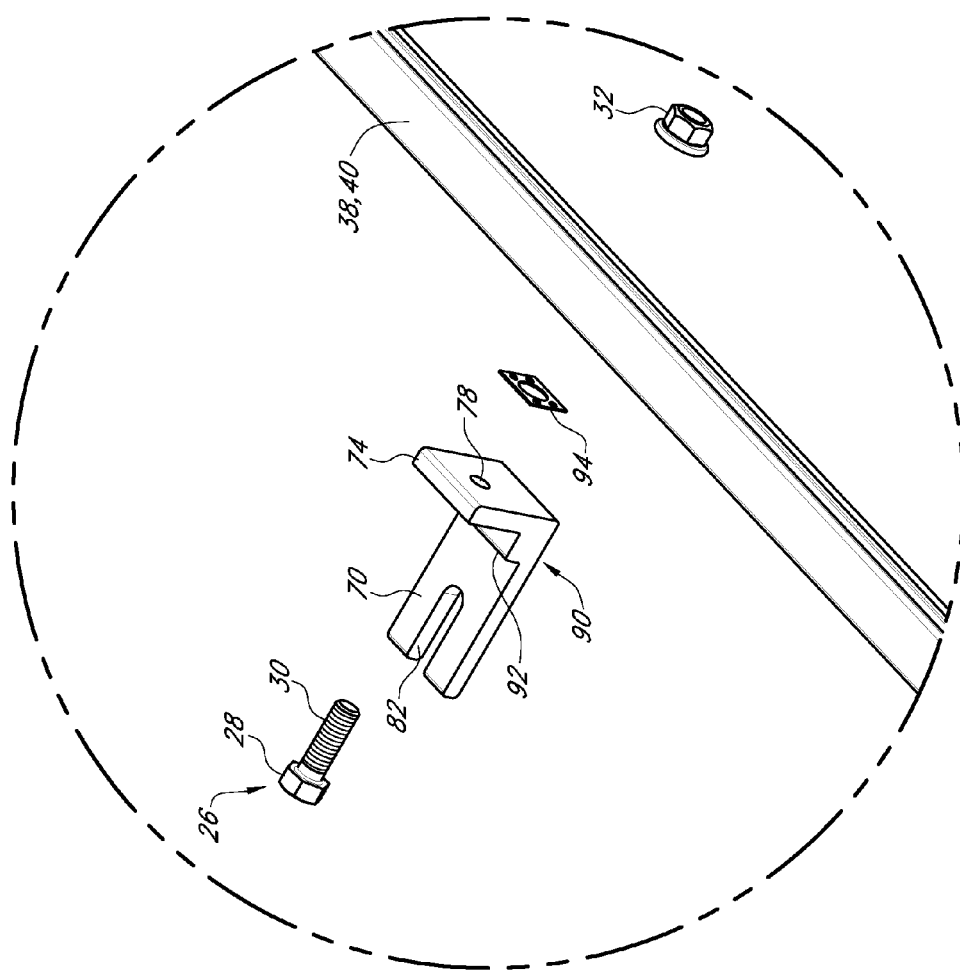
FIG. 8 is a perspective exploded view of a weeb leg and a weeb as well as a fastening member and a side frame member.
Figure 9:
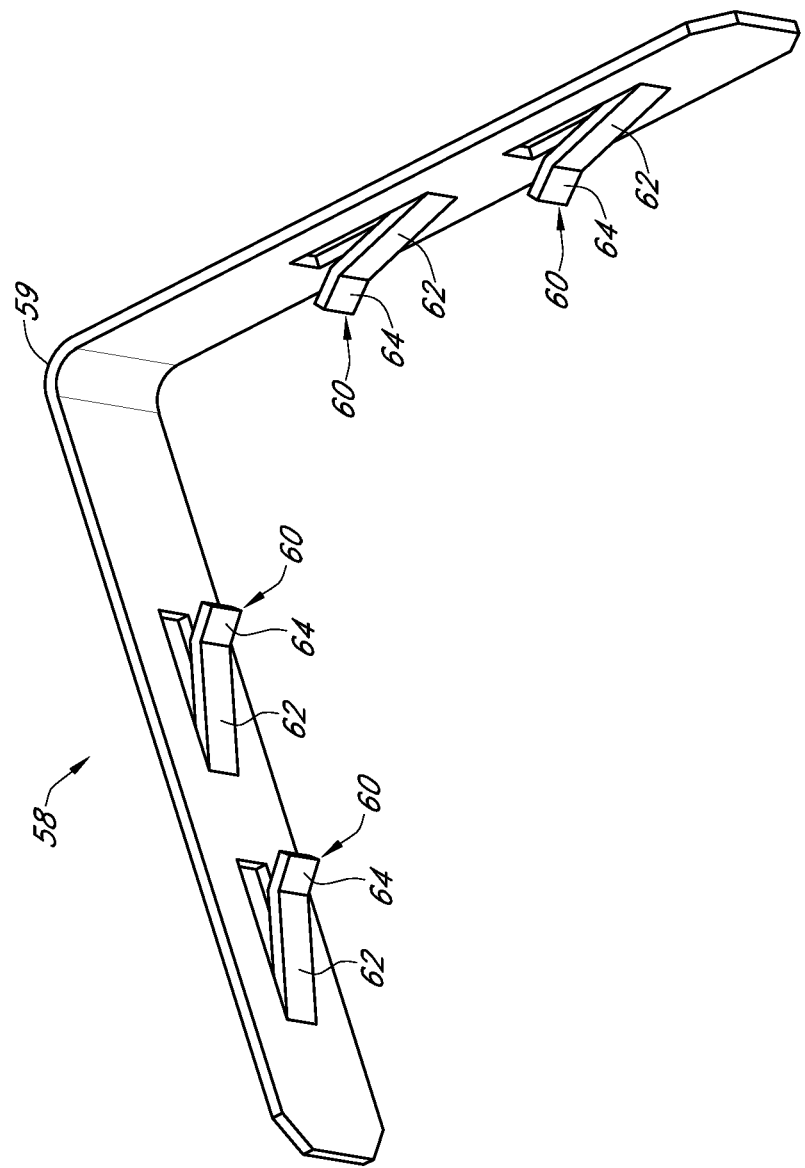
FIG. 9 is a perspective view of a corner connector.
Figure 10:
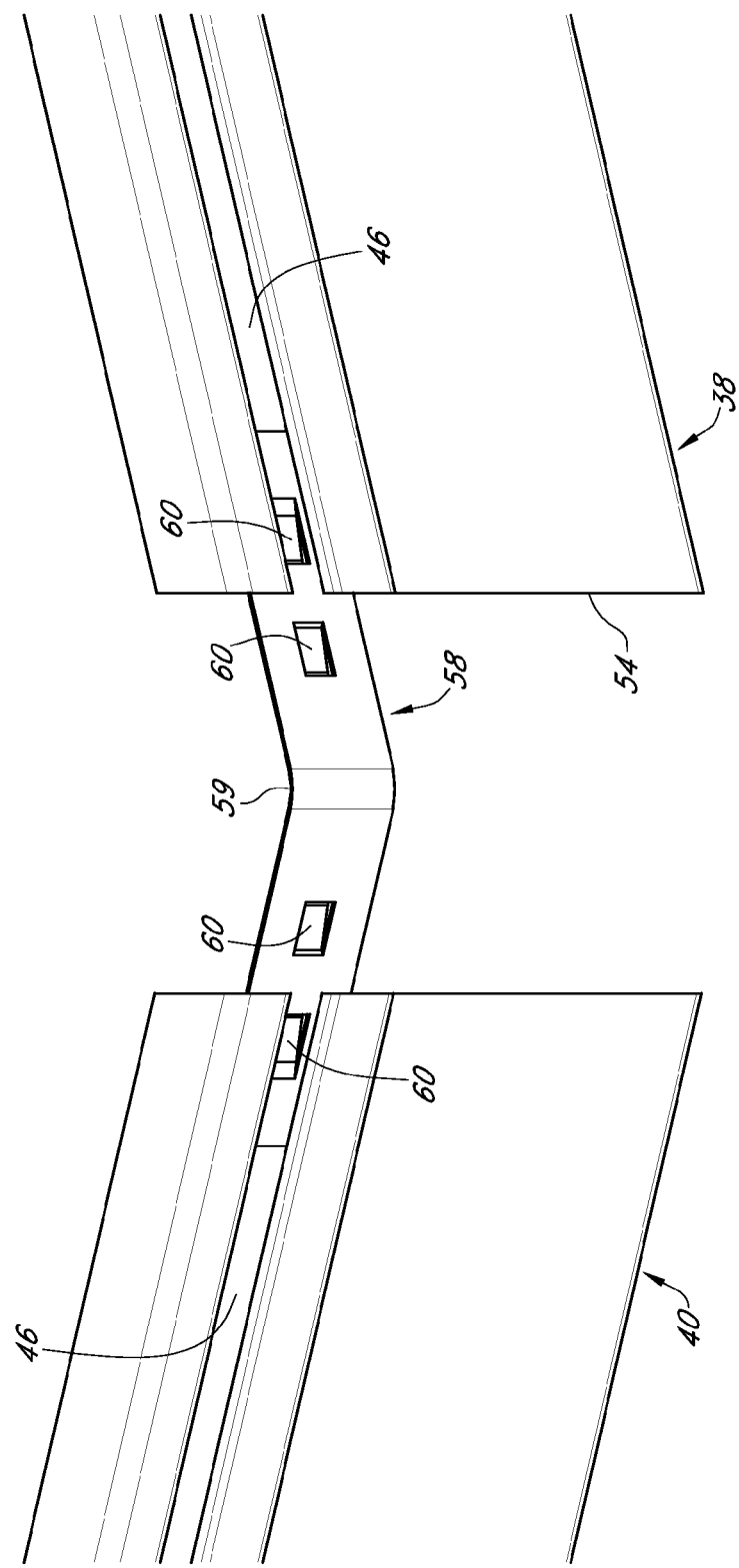
FIG. 10 is a perspective view of a corner connector partially inserted within the channels of a side frame member and end frame member.
Figure 11:
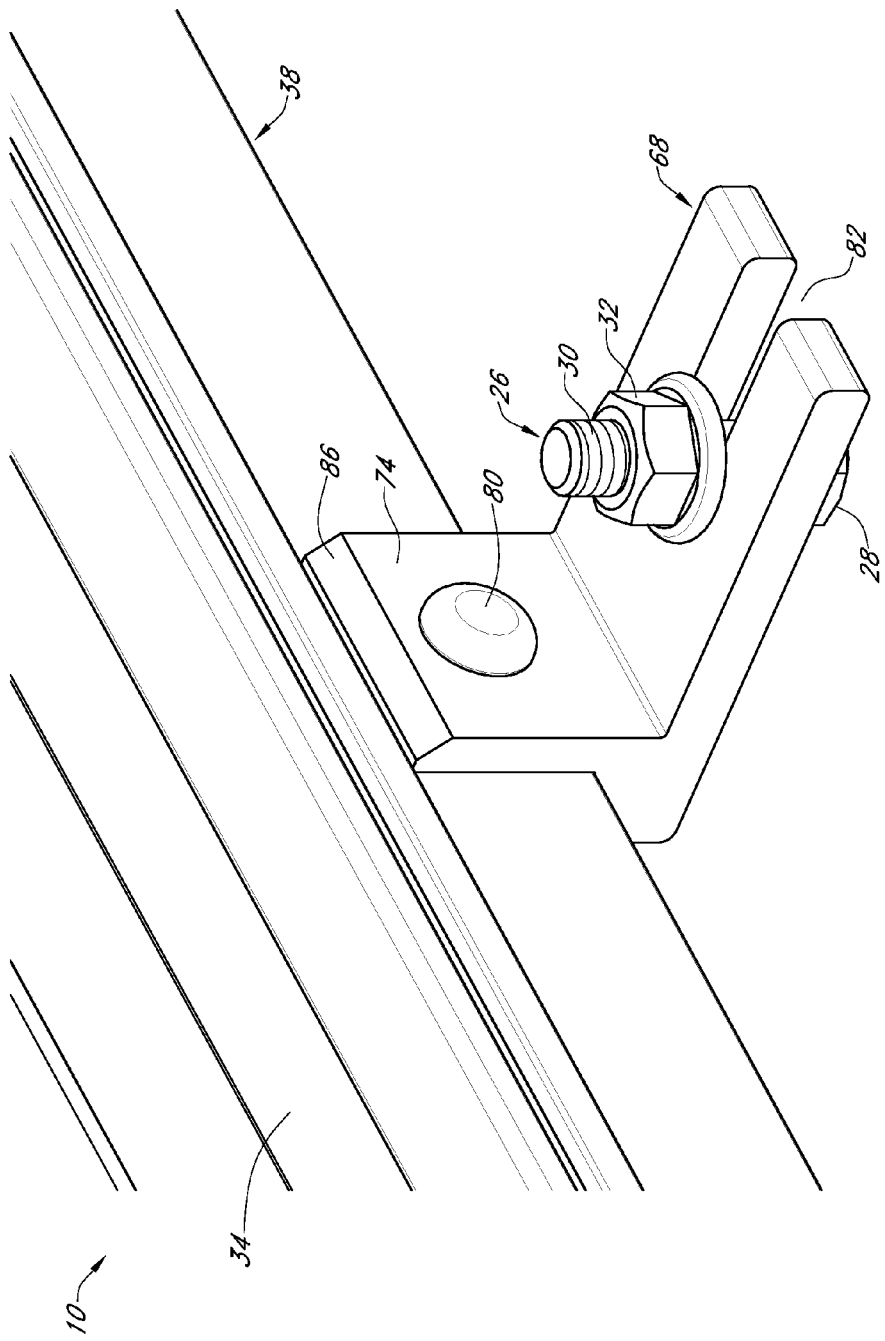
FIG. 11 is a perspective view of a leg riveted to a side frame member connected to a solar panel, this arrangement is shown as the last solar panel connected in an array as no short leg is present on top of the long leg.
Figure 12:
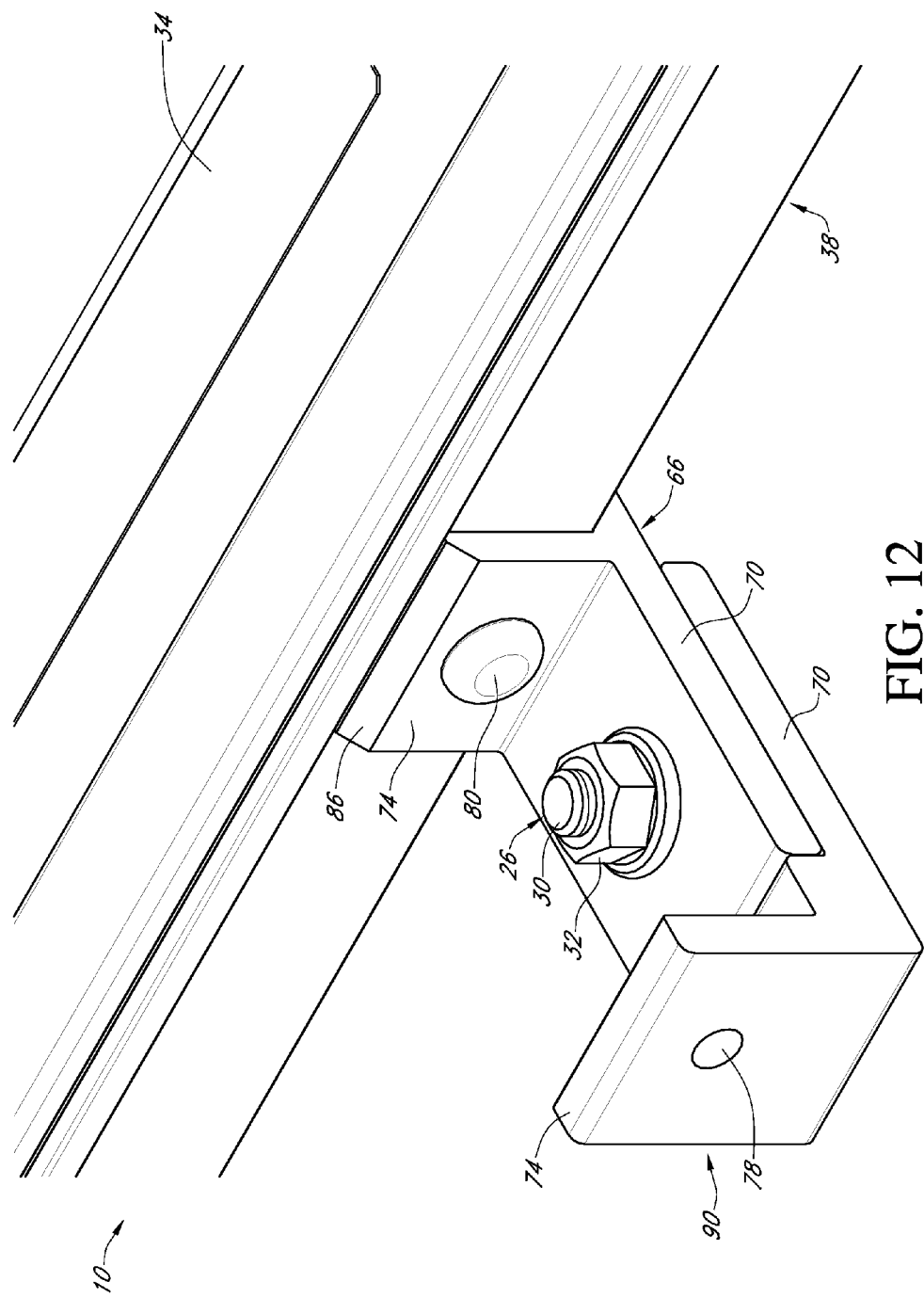
FIG. 12 is a perspective view of a weeb leg with a short leg stacked on top of the weeb leg, the short leg fastened to a side frame member, and a fastening member tightening the weeb leg and short leg together.
Figure 13:
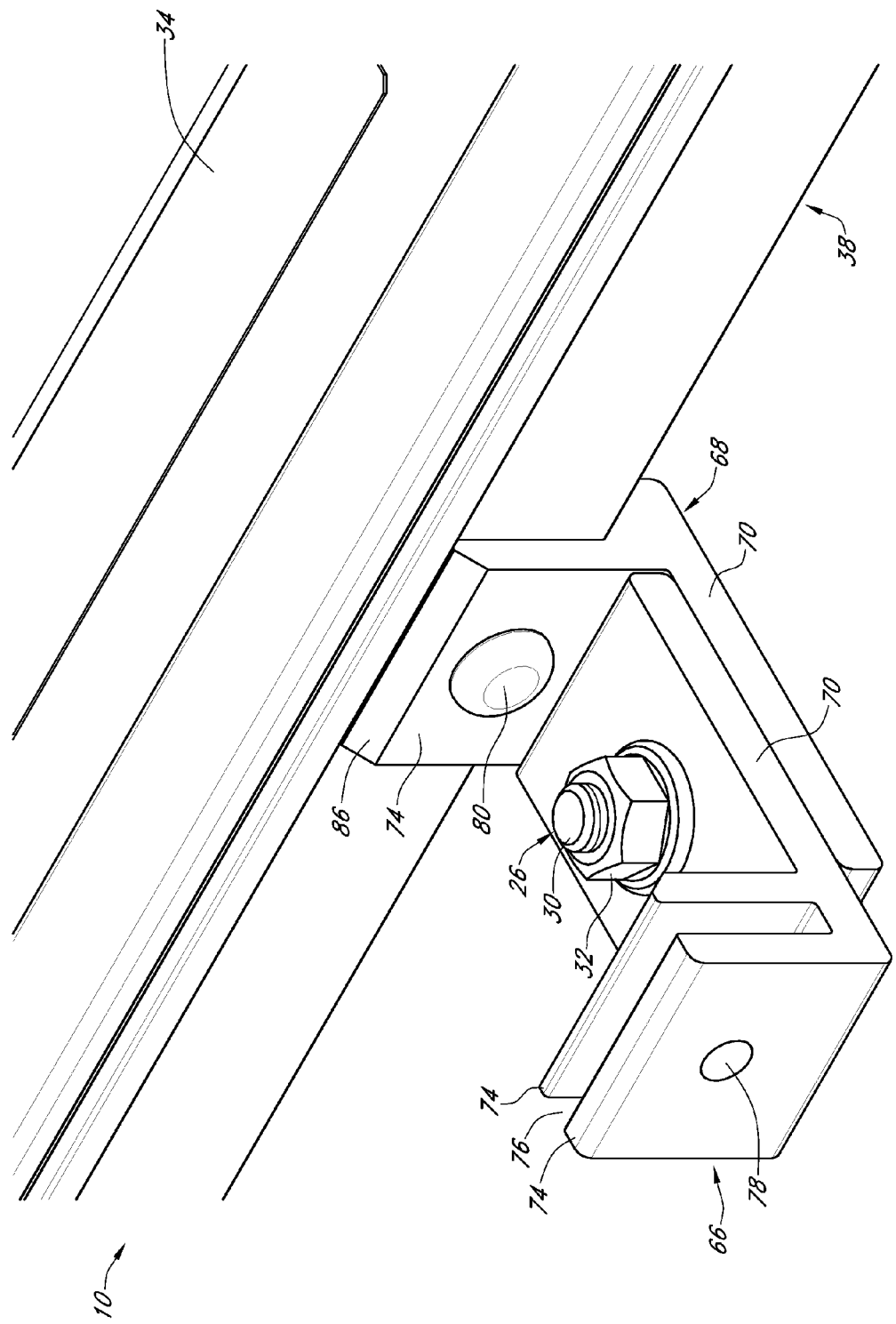
FIG. 13 is a perspective view of a long leg riveted to a side frame member and a short leg placed on top of the long leg and a fastening member tightening the long leg and short leg together.
Figure 14:
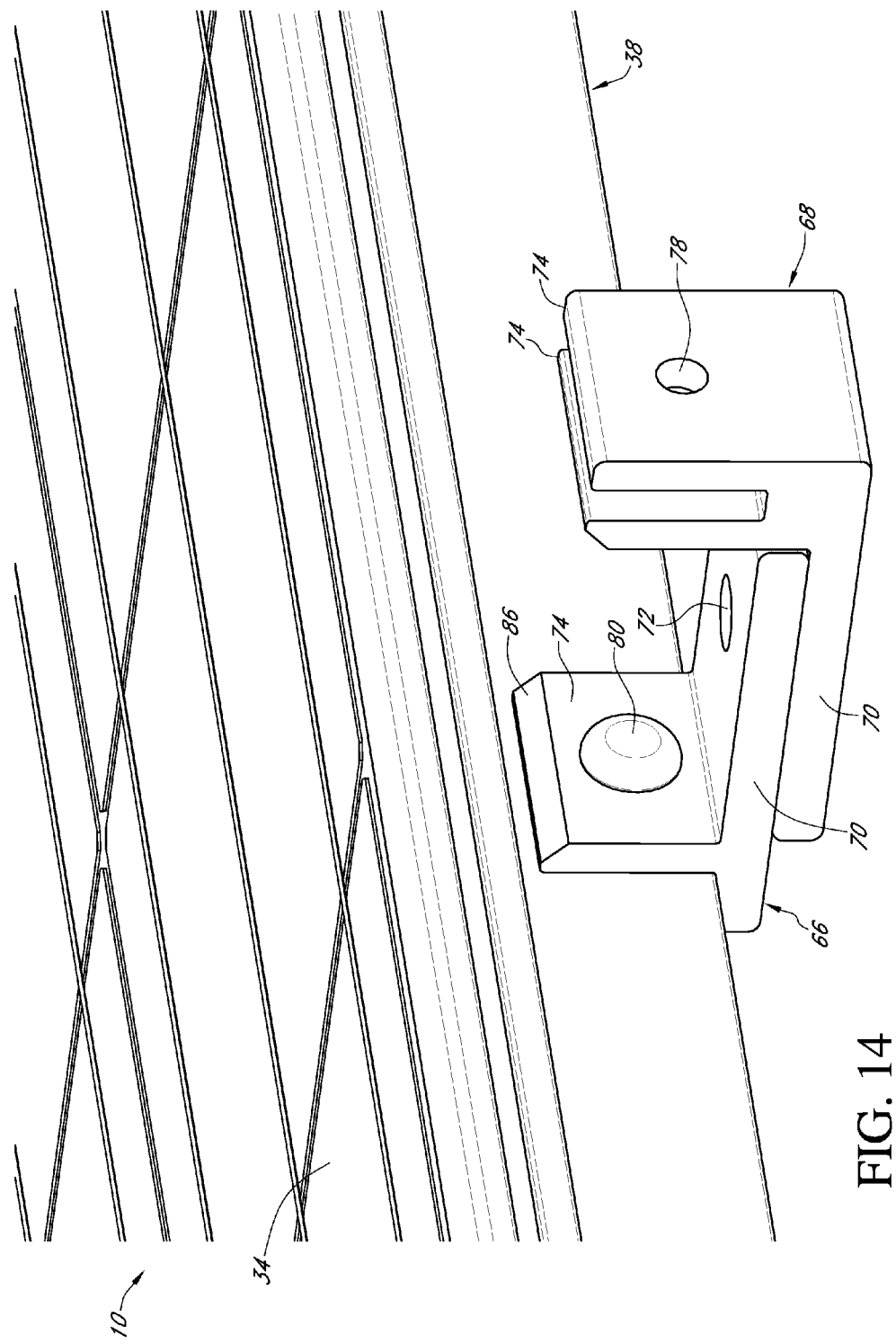
FIG. 14 is a perspective view of a short leg riveted to a side frame member and a short leg placed on top of the long leg.
Figure 15:
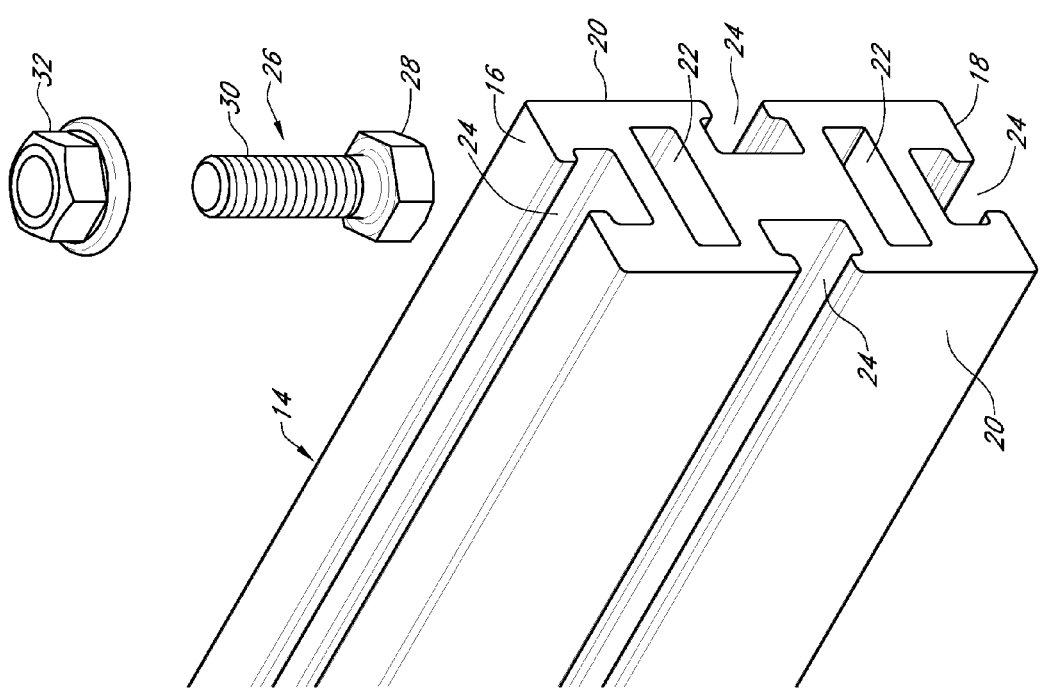
FIG. 15 is a side cut-away perspective view of a support member, showing the hollow cavities extending the length of the support member, as well as the plurality of locking channels in the upper surface, bottom surface and sidewalls that extend the length of the support member.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that mechanical, procedural, and other changes may be made without departing from the spirit and scope of the present inventions. The following detailed description is, therefore, not to be taken in a limiting sense, and the scope of the present invention is defined only by the appended claims, along with the full scope of equivalents to which such claims are entitled.

As used herein, the terminology such as vertical, horizontal, top, bottom, front, back, end and sides are referenced according to the views presented. It should be understood, however, that the terms are used only for purposes of description, and are not intended to be used as limitations. Accordingly, orientation of an object or a combination of objects may change without departing from the scope of the invention.

With reference to the drawings, a universally mounted micro inverted solar module system 10 is presented which is attached to the roof or another portion of a structure 12 (not shown) by any manner, method or means known in the art. The system 10 includes a plurality of lengthwise support members 14 or rails that are connected to structure or roof 12 by any manner, method or means, such as the use of brackets or the like.

In the arrangement shown, a plurality of support members 14 extend in parallel spaced alignment to one another across a portion of structure or roof 12. While the arrangement shows the support members 14 extending lengthwise, it is hereby contemplated that they could extend forward to back, vertically or at any other angle or orientation.

In the arrangement shown, a first support member 14A is positioned at or adjacent the forward end, or lower end; a second support member 14B is spaced a distance upward therefrom; a third support member 14C is spaced a distance upward therefrom; and a fourth support member 14D is spaced a distance upward therefrom. In this way a plurality of support members 14 are positioned across the structure 12 in approximate parallel spaced alignment. While four support members 14, are shown, any number of support members 14 are hereby contemplated for use such as one, two, three, five or more.

In one arrangement, each support member 14 is formed from an extruded piece material having features that extend across a portion or the entire length of the support member 14. In the arrangement shown, as one example, support member 14 is formed of a generally rectangular body having a generally flat upper surface 16 and a generally flat bottom surface 18, that oppose one another and define planes that extend in generally parallel spaced relation to one another. Support member 14 also includes a pair generally flat sidewalls 20 that oppose one another and define planes that extend in generally parallel spaced relation to one another. In this way, upper surface 16 and bottom surface 18 extend in generally perpendicular alignment to sidewalls 20, thereby defining a generally square or rectangular body, however any other shape is hereby contemplated for use.

As is shown, support member 14 includes at least one hollow cavity 22. In the arrangement shown, support member 14 includes a pair of hollow cavities 22, one positioned adjacent the upper surface 16 and one positioned adjacent the bottom surface 18. As is shown, hollow cavity 22 is generally square or rectangular in shape. These hollow cavities 22 provides the benefits of both reducing the amount of material needed for the support member 14, thereby reducing its material cost, while simultaneously increasing its strength.

A locking-channel 24 is positioned in the upper surface 16, the bottom surface 18 and, optionally, one or both sidewalls 20. Locking-channel 24 is any form of a channel that is used to receive a fastening members 26, such as one or more screws, nuts or bolts or the like. In the arrangement shown, locking-channel 24 is, when viewed from an end of the support member 14 a T-shaped slot. In the arrangement shown, the T-shaped slot is sized and shaped to slidably receive the head 28 of the fastening member 26 while allowing the shaft 30 of the fastening member 26 to slide along the length of the locking-channel 24. This allows for lateral adjustability along the length of support members 14. That is, by allowing the head 28 of fastening member 26 to slide along the length of locking channel 24 this allows fastening member 26 to be positioned at any position along the length of support member 14 thereby providing infinite adjustability. In one arrangement, the locking channels 24 on the upper surface 16, the bottom surface 18 and sidewalls 20 are all the same size and shape. In this way, a single sized and shaped fastening member 26 can be used for all of the upper surface 16, the bottom surface 18 and sidewalls 20 thereby eliminating the need for multiple sizes of fastening members 26. In the arrangement shown, a nut 32 threadably connects to shaft 30 thereby facilitating fastening. In this arrangement, nut 32 has approximately the same exterior size and shape as head 28 and therefor also slidably fits within locking channel 24.

A plurality of solar panels 34 are connected to the plurality of support members 14. In the arrangement shown, each solar panel 34 connects to or across a pair of adjacent support members 14. Solar panels 34 are any form of a solar panel as is known in the art such as a rigid solar panel, a flexible solar panel, or the like. Solar panels 34 are of any size and shape. In the arrangement shown, solar panels 34 are generally thin and planar and have a generally rectangular shape.

Solar panels 34, by nature, are generally fragile. To bolster their rigidity, improve longevity and ease installation, a frame 36 is positioned around each solar panel 34. Frames 36 are formed of side frame members 38, which are positioned along and engage the sides of the solar panels 34, and end frame members 40 (also known as top and bottom frame members). Side frame members 38 and end frame members 40 connect in end-to-end perpendicular alignment to form a mating frame around each solar panel 34. Alternatively, or as is shown, the outward ends of side frame members 38 and end frame members 40 are cut at approximately a 45° angle to the length of the side frame members 38 and end frame members 40 and these cut ends then abut one another in an abutting picture-frame-type arrangement.

Side frame members 38 and end frame members 40 are formed of any suitable size, shape and design. In one arrangement, as is shown, side frame members 38 and end frame members 40 have a center wall 42 which separates an inward facing groove 44 from an outward facing, or opposite, channel 46. Groove 44 is formed of any suitable size, shape and design. In the arrangement shown, groove 44 has a pair of opposing flanges 48 separated by a distance that is sized and shaped to receive the solar panel 34. In the arrangement shown, flanges 48 extend outward from center wall 42 in generally perpendicular alignment to center wall 42. Flanges 48 are generally flat and straight and extend in approximate parallel spaced relation to one another and thereby define a generally U-shaped space there between. The surface of upper flange 48 is generally in flat and flush alignment with the upper end of center wall 42.

Channel 46 is any form of a channel. In the arrangement shown, channel 46 is a T-shaped channel, or T-slot, similar to that described herein with respect to the support member 14. Channel 46 has a pair of opposing flanges 50 separated by a distance that is sized and shaped to receive the head 28 or nut 32 of a fastening member 26. In the arrangement shown, flanges 50 extend outward from center wall 42 in generally perpendicular alignment to center wall 42 and then extend inward a distance at lips 52 thereby forming a narrower gap between the inward ends of lips 52. While the space between flanges 50 is sized and shaped to allow head 28 or nut 32 of a fastening member 26 to be slidably received therein, the narrower distance formed by lips 52 prevents the head 28 or nut 32 of a fastening member 26 from escaping while allowing the shaft 30 of fastening member 26 to slide therein. The surface of upper flange 50 is generally in flat and flush alignment with the upper end of center wall 42.

In the arrangement shown, the upper surface of center wall 42, upper flange 48 of groove 44, and the upper flange 50 of channel 46 extend in generally flat, flush and planar parallel alignment to one another.

A vertically elongated mounting flange 54 extends outwardly from the bottom surface of center wall 42, the bottom flange 48 of groove 44 and the bottom flange 50 of channel 46. Mounting flange 54 is generally flat and straight and extends in parallel alignment with center wall 42 and in perpendicular alignment with the bottom flange 48 of groove 44 and the bottom flange 50 of channel 46. Mounting flange 54 includes a plurality of mounting holes or slots 56 therein. In one arrangement, mounting flange 54 has a slightly greater thickness than center wall 42 to provide additional strength and rigidity.

In one arrangement, both side frame members 38 and end frame members 40 are formed out of an extrusion that includes mounting flange 54. This arrangement allows for a single extrusion to be used for multiple pieces (both side fame members 38 and end frame members 40) thereby reducing manufacturing cost. However, in an alternative arrangement, end frame members 40 lack mounting flange 54. This arrangement, where mounting flange 54 is eliminated from end frame members 40 reduces the amount of material in end frame members 40 and allows for greater air flow around solar panel 34.

To assemble the frame 36 around solar panel 34, a pair of side frame members 38 and a pair of end frame members 40 are cut to length with approximately 45° corners, such that when the ends of the side frame members 38 and end frame members 40 are positioned in end-to-end mating and flush alignment. The frame 36 is formed that is sized and shaped to receive solar panel 34 within close and tight tolerances within the inward facing grooves 44. In this arrangement, the solar panel 34 is completely surrounded by the solar panel frame 54, thereby providing strength, durability and rigidity to the generally fragile solar panel 34.

The side frame members 38 and end frame members 40 are connected to and fastened to one another by inserting corner connectors 58 within the channels 46 of adjacent side frame members 38 and end frame members 40. Corner connectors 58 are formed of any suitable size, shape and design. In the arrangement shown, corner connectors 58 are formed of a generally planar but narrow and elongated piece of material that is bent into a 90° corner approximately at a midpoint 59, thereby separating the corner connector 58 into opposing sides that extend at approximate perpendicular alignment to one another. Along its length one or more spring loaded tabs 60 are punched out of and bend away from the main body of corner connectors 58. These spring loaded tabs 60 angle outwardly from the main body of corner connectors 58 and in the arrangement shown, spring loaded tabs 60 extend outwardly from the inward surface of corner connector 58 with a connected end towards the outward end of corner connector 58 and a free or unattached end that points toward the midpoint 59 in corner connector 58. Spring loaded tabs 60 have a first portion 62 that extend outwardly from the main body of the corner connector 58 at a first angle; and a second portion 64, or barb, that extends outwardly from the end of first portion 62 at a second angle, wherein the second angle is steeper or greater than the first angle. When inserted within the channel 46 of side frame members 38 and end frame members 40 the spring loaded tabs 60 frictionally engage and deflect to lock the side frame members 38 and end frame members 40 together. This insertion of the corner connectors 58 provides a strong and rigid connection that prevents unintentional disassembly of the frame 36 around solar panel 34, while allowing intentional disassembly when desired without the use of additional tools.

Side frame members 38 are connected to support members 14 by an arrangement of short legs 66 and long legs 68. Short legs 66 and long legs 68 are formed of any suitable size, shape and design.

In the arrangement shown, short legs 66 include a rectangular generally elongated and planar base 70 with a mounting hole 72 positioned therein. A pair of flanges 74 extend upwardly from base 70 in parallel spaced relation to one another thereby forming a slot 76 between the pair of flanges 74. This slot 76 is sized and shaped to receive the mounting flange 54 of side frame members 38 within close and tight tolerances. That is, the width of slot 76 is approximately the width of flange 54, and the depth of slot 76 is approximately the height of mounting flange 54. A mounting hole 78 extends through flanges 74 at approximately its midpoint. When mounting flange 54 of side frame member 38 is inserted within slot 76 of short leg 66, a rivet 80, or other fastening member such as a screw, bolt or the like (which can be similar or identical to fastening member 26), is inserted through the mounting holes 78 of both flanges 74 of short leg 66 and mounting flange 54.

In the arrangement shown, long legs 68 are similar to short leg 66. Long legs 68 include a rectangular generally elongated and planar base 70, similar in size, shape and thickness to that of short leg 66. Long leg 68 includes a mounting slot 82 therein instead of the mounting hole 72 of short leg 66. A pair of flanges 74 extend upwardly from base 70 in parallel spaced relation to one another thereby forming a slot 76 between the pair of flanges 74. This slot 76 is sized and shaped to receive the mounting flange 54 of side frame members 38 within close and tight tolerances. That is, the width of slot 76 is approximately the width of flange 54, and the depth of slot 76 is approximately the height of mounting flange 54. A mounting hole 78 extends through flanges 74 at approximately its midpoint. When mounting flange 54 of side frame member 38 is inserted within slot 76 of short leg 66, a rivet 80, or other fastening member such as a screw, bolt or the like (which can be similar or identical to fastening member 26), is inserted through the mounting holes 78 of both flanges 74 of long leg 68 and mounting flange 54.

While the mounting slot 76 of long leg 68 is approximately the same size, shape and depth as the mounting slot 76 of short leg 66, the bottom of mounting slot 76 of long legs 68 are raised above the upper surface base 70 approximately a distance, labeled X, that is equivalent to the thickness of base 70. In contrast, the bottom of mounting slot 76 of short legs 66 is approximately in alignment with the upper surface of base 70. By raising the bottom of mounting slot 76 of long leg 68 up the equivalent distance as the thickness of base 70 of short leg 66 this allows the base 70 of short leg 66 to be stacked on top of the base 70 of long leg 68. When the base 70 of short leg 66 to be stacked on top of the base 70 of long leg 68 bottom of mounting slots 76 of both the short leg 66 and the long leg 68 are in approximate planar alignment with one another.

To install a pair of solar panels 34 with frames 36, the head 28 of fastening member 26, such as a bolt, screw or the like is inserted into the upper locking-channel 24 of the support member 14 and slid to a position wherein the solar panel 34 and frame 36 is to be mounted. Then the elongated shaft 30 of fastening member 18 is inserted through the mounting slot 82 of long leg 68 and then the mounting hole 72 of short leg 66. That is, the base 70 of long leg 68 is placed over the fastening member 26 first and then the base 70 of short leg 66 is stacked on top of the base 70 of the long leg 68. Thereafter the fastening member 26 is tightened by placing a nut 32 over the shaft 30 and tightened. This process is repeated for each set of side-by-side solar panels 34.

To install the first solar panel in an array, because there is no adjacent long leg 68 to be placed under the short leg 66, a spacer 84 is used. Spacer 84 is approximately sized and shaped like the base 70 of long leg 68 and/or short leg 66 and includes a mounting hole 72 therein, like long leg 68 and/or short leg 66. In this way, on the first or last solar panel 34 in an array of solar panels 34, by placing a spacer 84 under the first short leg 66 levels-out the solar panel 34.

In one arrangement, frames 36 are assembled around each solar panel 34 at the factory. A pair of short legs 66 are bolted, screwed or permanently riveted onto the mounting flanges 54 on one side frame member 38 and a pair of long legs 68 are bolted, screwed or permanently riveted to the opposite side frame member 38. This way, the solar panel 34, frame 36 and legs 66/68 come as a modular unit that is already assembled. In this way, the use of support members 14 and frames 36 with short legs 66 and long legs provide a simple and easy manner of installing solar panels 34 with a great amount of adjustability and ease.

In this way, the use of support members 14 with locking-channels 24 provides a simple and easy manner of installation of both the solar panel 34 and frame 36 and the support members 14.

Assembly: To assemble the system 10, the plurality of support members 14 are installed onto structure or roof 12 in a conventional manner. Generally this is accomplished by installing a plurality of brackets onto the structure or roof 12. Next, the head 28 of fastening member 26 is slid into the locking channel 24 on the bottom surface 18 of support member 14 and is slit to the position of the bracket and is tightened. This process is repeated for each bracket until the support member 14 is mounted appropriately.

The solar panel frames 36 are assembled around each solar panel 34 by installing the side frame members 38 along the sides of the solar panels 34 and end frame members 40 along the ends of the solar panels 34. In this arrangement, the solar panels 34 are received within the grooves 44 of the side frame members 38 and the end frame members 40 and corner connectors 58 are inserted into the channels 46 of the side frame members 38 and the end frame members 40. When fully inserted, the spring loaded tabs 60 bite into the channels 46 thereby holding the frame 36 together.

In one arrangement, a pair of short legs 66 are installed on the mounting holes 56 on one side frame member 38 and a pair of long legs 68 are installed on the mounting holes 56 on the opposite frame member 38. In one arrangement, these short legs 66 and long legs 68 are permanently riveted to the mounting holes 56 from the factory using rivet 80. In an alternative arrangement, short legs 66 and long legs 68 are fastened to the mounting holes 56 of mounting flanges 54 of side frame members 38 using a fastening member 26, which allows for removal of the legs 66/68 in the field as well as the ability to adjust the tightness of the connection between mounting flange 54 and legs 66/68.

In one arrangement, to compensate for when adjacent support members 14 are mounted imprecisely, one or more mounting holes 56 on side frame members 38 are formed of lateral slots, instead of round holes. These mounting slots to provide some adjustment and allow the legs 66, 68 to laterally slide into the precise position of support member 14. In one arrangement, side frame members 38 have one mounting hole 56 formed as a circular hole that closely matches the diameter of rivet 80 or fastening member 26 used to attach leg 66, 68 and the other mounting hole 56 is formed of a slot that has a height that closely matches the diameter of rivet 80 or fastening member 26 used to attach leg 66, 68 however it has a lateral length many times longer than the diameter. In one arrangement, the length of these slots are approximately one inch long. With one mounting hole 56 and one mounting slot 56 on each side frame member 38 this allows for precise matching of the legs 66, 68 and 90 to the position of the support members 14. This adjustability eases and speeds installation and improves the durability and rigidity of installation.

To install a framed solar panel 34, the head 28 of a fastening member 26 is inserted into the upper locking-channel 24 of support members 14 and slid to the appropriate position for elongated shaft 22 to extend through the mounting slot 82 of the long leg 68 and mounting hole 72 of the short leg 66. Once in position, the shaft 30 of the fastening member 26 is inserted into mounting slot 82 of the long leg 68 and mounting hole 72 of the short leg 66 and tightened into place using a conventional nut 32.

By having the head of fastening member 26 be held in place by locking-channel 24 while allowing the fastening member 26 to slide laterally along the length of support members 14 this provides infinite adjustability and ease of assembly. This is partly because the fastening member 26 cannot fall out of locking-channel 24. In addition, the presence of a mounting slot 82 in long leg 68 provides additional adjustability, without complicated clips or other unnecessarily complicated parts.

In addition, by having the frame 36 installed around solar panel 34 with short legs 66 and long legs 68 attached to mounting flanges 54 at the factory, this eases and speeds the installation process. All that is required, is inserting the fastening members 26 into the locking channels 24 of the frame members 14 this eliminates almost all on-site assembly.

Once assembled, as can be seen in the figures, a space is positioned between the adjacent edges of horizontally and vertically positioned adjacent solar panels 34. In addition, because mounting flanges 54 are elongated, or vertically tall, this provides ample space for air movement underneath the bottom surface of the solar panel 34. These spaces provide for ample air flow between and around solar panels 34. This air flow helps to keep the solar panels 34 cool which helps to improve their efficiency and longevity. The raised mounting flanges 54 prevents the build-up of hot air below the solar panels 34 and encourages air movement and heat transfer. This air flow also helps to prevent damage to the system 10 during high wind conditions, such as thunderstorms, hurricanes, tornados and straight line winds, as air easily flows through the system 10 thereby preventing or reducing any damage.

Stacked Legs: In one arrangement, as is shown, it may be desirable to position the solar panel 34 as close to one another as possible. In this arrangement, the short legs 66 on one side of a solar panel 34 are stacked on top of the long legs 68 of the adjacent solar panel 34 and fastened to support member 14 using a single fastening member 26. In this arrangement, the base 70 of short legs 66 are stacked on top of the base 70 of long leg 68 in flat and flush alignment, with the mounting hole 72 of short leg 66 in alignment with the mounting slot 82 of long leg 68 and tightened against one another by fastening member 26 to support member 14. Due to this stacking, in this arrangement, it is necessary for long leg 68 to be longer or higher than short leg 66.

In this arrangement, the upper edges of flanges 74 of long leg 68 and short leg 66 are positioned in approximate parallel spaced alignment to one another, as is the depth of the groove slots 76 of the long leg 68 and the short leg 66. This alignment allows for positioning adjacent solar panels 34 in approximately the same vertical plane to one another and level to one another. Also in this arrangement, to provide for some adjustability, it may be desired for one of the long leg 68 or the short leg 66 to have a slot instead of a mounting hole so as to provide for some lateral adjustability.

As is also shown, the upper, inner edge 86 of flanges 74 is chamfered or rounded or smoothed. This chamfered or rounded or smoothed edge 86 eliminates a sharp or hard edge and reduces the possibility of debris build up or objects hanging up on the sharp edge, and improves the safety of the system. Another improvement of the system 10, that when installed, while the shaft 30 and nut 32 of fastening member 26 extends above the stacked bases 70 of short leg 66 and long leg 68, the upper most end of fastening member 26 remains substantially recessed from the upper surface of solar panel 34 and/or frame 36. This provides a smooth, flat and flush upper surface to the array of solar panels 34. That is, there are no protruding bolts, posts, knobs or any other structures, like many prior art systems, that could cause safety issues and encourage build up or hang up of debris.

Method of Installation: In one arrangement, an array of solar panels 34 with preassembled frames 36 with short legs 66 on one side and long legs 68 on the other side are installed in the following manner.

Step 1: A plurality of support members 14 are attached to a roof or structure 12. Care is taken to ensure the support members 14 are installed at spacing to one another that matches the spacing between short legs 66 and/or long legs 68.

Step 2: A plurality of fastening members 26 are inserted into the upper locking channel 24 of the support members.

Step 3: The first side of the first solar panel 34 is installed. A pair of fastening members 26 are slid to the desired position of the first solar panel 34. A spacer 84 is placed over the shaft of the first fastening member 26 and then the first short leg 66 is placed over the space 86. Next, with the spacer 84 and base 70 of short leg 66 in stacked alignment, a nut 32 is placed on the shaft 30 of fastening member 26 and is tightened in place thereby anchoring one side of the first solar panel 34 in place.

Step 4: The opposite side of the first solar panel 34 is installed. A pair of fastening members 26 are slid to the position of the long legs 68 on the opposite side of solar panel 34. The base 70 of long leg 68 is placed over the shaft 30 of the fastening member 26.

Step 5: The first side of the second solar panel 34 is installed. The base 70 of the short legs 66 are placed over the shaft 30 of the fastening member 26 such that the base 70 of the short leg 66 is in flat and flush stacked alignment with the base 70 of the long leg and a nut 32 is placed on the shaft 30 of fastening member 26 and is tightened in place thereby anchoring second side of the first solar panel 34 and the first side of the second solar panel 34.

Step 6: This process is repeated for all solar panels 34 in the array.

In yet another alternative arrangement, instead of long leg 68 and short leg 66 being formed of separate pieces requiring assembly in the field, long leg 68 and short leg 66 are formed of a single unitary piece. While this single piece eliminates the adjustability provided by using independent long legs 68 and short legs 66, this improves rigidity and eliminates a part or piece as well as some assembly. To provide some adjustability, the single piece may have a mounting slot in its base to receive fastening member 26 thereby providing some lateral adjustability in locking-channel 24 of support member 14.

Weeb Leg: In many applications it is desired or required to ground the solar panel system 10. In one arrangement, as is shown, a weeb leg 90 is presented. Weeb leg 90 is much like short leg 66 and long leg 68. Weeb leg 90 includes a rectangular generally elongated and planar base 70, similar in size, shape and thickness to that of short leg 66 and long leg 68. Weeb leg 90 includes a mounting slot 82 therein instead of the mounting hole 72 of short leg 66. As is shown, a single flange 74 extends upwardly from base 70 in perpendicular alignment to the plane of base 70. A step 92 is positioned at the bottom of flange 74. Step 92 is the same height as the thickness of base 70 of short leg 66, and therefore, in this way, weeb leg 90 is similar to long leg 68 in that when the upper surface of step 92 is in contact with the bottom of mounting flange 54 of side frame member 38 the bottom of base 70 is in flat and flush planar alignment with other long legs 68 connected to side frame member 38. Flange 74 includes a mounting hole 82 therein at approximately its midpoint.

Weeb leg 90 is used in association with a weeb clip 94. Weeb clip 94 is used to ground or transmit electrical current between frame 36 and solar panel 34 to weeb leg 90 and to whatever ground weeb leg 90 is connected to. Weeb clip 94 is formed of any suitable size shape and design. In the arrangement shown, weeb clip 94 is a generally planar square or rectangular in shape and includes a large circular opening 96 through its middle. A generally cylindrical protrusion 98 is positioned approximately in each corner of weeb clip 94 and extends perpendicularly from the generally planar surface of weeb clip 94. These protrusions extend outward from both surfaces of weeb clip 94 in a symmetric fashion. In one arrangement, a groove or recess extends between pairs of protrusions 98 on each side of weeb clip 94.

Weeb leg 90 and weeb clip 94 are connected to frame 36 and create an electrical connection between the weeb leg 90 and the frame 36 and solar panel 34. To install the weeb leg 90, the flange 74 of the weeb leg 90 is placed behind the mounting flange 54 of a side frame member 38. A weeb clip 94 is placed between the flange 74 of the weeb leg 90 and the mounting flange 54 of the side frame member 38. Next, a shaft 30 of fastening member 26 is inserted through the mounting hole or slot 56 in the mounting flange 54 and the mounting hole 78 in the flange 74 of the weeb leg 90 and the opening 96 in the center of the weeb clip 94. Next, the nut 32 is placed over the shaft and tightened in place. This tightening causes the protrusions 98 of weeb clip 94 to dig into or make a strong electrical connection between the mounting flange 54 of side frame member 38 and flange 74 of weeb clip 90. In this way, a weeb leg 90 can be used to replace a long leg 68 in the system 10. An electrical lead is then connected to the weeb leg 90 and the entire system 10 is grounded.

While the mounting slot 76 of long leg 68 is approximately the same size, shape and depth as the mounting slot 76 of short leg 66, the bottom of mounting slot 76 of long legs 68 are raised above the upper surface base 70 approximately a distance, labeled X, that is equivalent to the thickness of base 70. In contrast, the bottom of mounting slot 76 of short legs 66 is approximately in alignment with the upper surface of base 70. By raising the bottom of mounting slot 76 of long leg 68 up the equivalent distance as the thickness of base 70 of short leg 66 this allows the base 70 of short leg 66 to be stacked on top of the base 70 of long leg 68. When the base 70 of short leg 66 to be stacked on top of the base 70 of long leg 68 bottom of mounting slots 76 of both the short leg 66 and the long leg 68 are in approximate planar alignment with one another.

Ground Mount: In one arrangement, the system presented herein is used and usable in association with a ground mount, including an adjustable ground mount that adjustably positions the solar panels at an angle to the sun. In this arrangement, the support members 14 are mounted to a frame of the ground mount and the solar panels 34 are mounted to the support members 14 in the manner described herein. In this way, the system 10 presented herein is used in association with a ground mount and an adjustable ground mount.

From the above discussion it will be appreciated that the universally mounted solar module described above offers and provides many advantages over the prior art. More specifically, the universally mounted solar module presented allows for convenient and easy installation of a plurality of solar panels. The universally mounted solar module is rigid and durable and can withstand high wind conditions without damage. The universally mounted solar module improves and maximizes the efficiency of solar panels. The universally mounted solar module allows for air to flow through and around the mounting structure and the solar panels mounted therein.

It will be appreciated by those skilled in the art that other various modifications could be made to the device without parting from the spirit and scope of this invention. All such modifications and changes fall within the scope of the claims and are intended to be covered thereby.

What is claimed:

1. A method of installing an array of solar panels, the steps comprising:
   providing a plurality of solar panels having a frame;
   connecting a first frame to a first solar panel;
   connecting a first short leg to a first side of the first frame;
   connecting a second frame to a second solar panel;
   connecting a first long leg to a second side of the second frame;
   connecting a plurality of support members having at least two T-shaped locking channels to a structure;
   placing the first short leg of the first solar panel on top of the first long leg of the second solar panel;
   connecting a first fastening member to a first support member of the plurality of support members;
   inserting a shaft of the first fastening member through the first short leg of the first solar panel and the first long leg of the second solar panel;
   tightening the fastening member thereby fastening the first solar panel and the second solar panel to the first support member and wherein the first short leg has a planar base and a single upwardly extending flange and a step positioned at the bottom of the flange.

2. The method of installing an array of solar panels of claim 1 wherein the first short leg is riveted to a mounting flange of the first frame.

3. The method of installing an array of solar panels of claim 1 wherein the first long leg is riveted to a mounting flange of the second frame.

4. The method of installing an array of solar panels of claim 1 wherein the shaft of the first fastening member is inserted through a mounting hole in the first short leg.

5. The method of installing an array of solar panels of claim 1 wherein the shaft of the first fastening member is inserted through a mounting slot in the first long leg.

6. The method of installing an array of solar panels of claim 1 wherein the plurality of frames are formed of side frame members and end frame members connected to one another by corner connectors.

7. The method of installing an array of solar panels of claim 1 wherein the first short leg includes a generally elongated and planar base and a pair of upwardly extending flanges at one end of the planar base that form a slot, wherein a mounting hole extends through the upwardly extending flanges.

8. A solar panel assembly comprising;
   a first solar panel having a frame;
   a short leg connected to the frame of the first solar panel;
   a support member having at least two T-shaped locking channels connected to the short leg;
   a structure connected to the support member;
   a second solar panel having a frame;
   a long leg connected to the frame of the second solar panel;
   wherein the first solar panel and second solar panel are installed on a support member such that the short leg of the first solar panel is stacked on top of the long leg of the second solar panel and a fastener is inserted through the short leg of the first solar panel and the long leg of the second solar panel and tightened in place and wherein the short leg has a planar base and a single upwardly extending flange and a step positioned at the bottom of the flange.

9. The solar panel assembly of claim 8 further comprising:
   a short leg connected to the frame of the second solar panel;
   a third solar panel having a frame;
   a long leg connected to the frame of the third solar panel;
   wherein the second solar panel and third solar panel are installed on the support member such that the short leg of the second solar panel is stacked on top of the long leg of the third solar panel and a fastener is inserted through the short leg of the second solar panel and the long leg of the third solar panel and tightened in place.

* * * * *